(12) United States Patent
Inoue

(10) Patent No.: US 8,592,919 B2
(45) Date of Patent: Nov. 26, 2013

(54) SEMICONDUCTOR DEVICE WITH SOURCE AND DRAIN FINGERS

(75) Inventor: Kazutaka Inoue, Kanagawa (JP)

(73) Assignee: Sumitomo Electric Industries, Ltd., Osaka (JP)

(*) Notice: Subject to any disclaimer, the term of this patent is extended or adjusted under 35 U.S.C. 154(b) by 161 days.

(21) Appl. No.: 13/182,922

(22) Filed: Jul. 14, 2011

(65) Prior Publication Data

US 2012/0012945 A1    Jan. 19, 2012

(30) Foreign Application Priority Data

Jul. 14, 2010   (JP) ................. 2010-160115

(51) Int. Cl.
*H01L 27/088* (2006.01)

(52) U.S. Cl.
USPC .......................................... 257/401

(58) Field of Classification Search
USPC .......................................... 257/401
See application file for complete search history.

(56) References Cited

U.S. PATENT DOCUMENTS

| | | | |
|---|---|---|---|
| 7,323,374 B2* | 1/2008 | Beintner et al. | 438/157 |
| 8,304,825 B2* | 11/2012 | Garnett | 257/302 |
| 2002/0180005 A1 | 12/2002 | Haematsu | |

FOREIGN PATENT DOCUMENTS

JP       2002-359257 A    12/2002

* cited by examiner

*Primary Examiner* — William D Coleman
(74) *Attorney, Agent, or Firm* — Westerman, Hattori, Daniels & Adrian, LLP

(57) ABSTRACT

A semiconductor device includes source electrodes having source fingers, drain electrodes having drain fingers, and gate electrodes having bent portions between steps formed in stepwise side portions of source fingers and steps formed in stepwise side portions of drain fingers and being bent in the bent portions along the source fingers and the drain fingers. A shape of the stepwise side portion of one source finger and that of the stepwise portion of the corresponding drain finger are symmetrical about a midpoint of an imaginary line that connects the other end of the source finger and the other end of the corresponding drain finger.

12 Claims, 11 Drawing Sheets

US 8,592,919 B2

SEMICONDUCTOR DEVICE WITH SOURCE AND DRAIN FINGERS

CROSS-REFERENCE TO RELATED APPLICATION

This application is based upon and claims the benefit of priority of the prior Japanese Patent Application No. 2010-160115 filed on Jul. 14, 2010, the entire contents of which are incorporated herein by reference.

BACKGROUND (i) Technical Field

A certain aspect of the embodiments discussed herein is related to a semiconductor device. Another aspect of the embodiments is related to a semiconductor device with an electrode shaped into steps.

(ii) Related Art

An FET (Field Effect Transistor) may be used as a semiconductor device that amplifies RF signals such as microwaves. The FET is configured to form a source electrode, a drain electrode and a gate electrode on a semiconductor substrate. Japanese Patent Application Publication. No. 2002-359257 discloses a multi-finger type FET in which source electrodes, drain electrodes and gate electrodes are arranged in the form of a tooth comb.

The magnitude of current that flows through an electrode of the semiconductor device is restricted by the tolerable current density, which depends on the material of the electrode. The restricted magnitude of current may not produce high power.

SUMMARY

According to an aspect of the present invention, there is provided A semiconductor device including: source electrodes that are provided on a semiconductor substrate and are having source fingers, the source fingers having stepwise side portions so that a length of the source fingers in a gate length direction decreases stepwise in a direction from ends of the source fingers connected to source pads towards other ends; drain electrodes that are provided on the semiconductor substrate and are having drain fingers, the drain fingers having stepwise side portions so that a length of the drain fingers in the gate length direction decreases stepwise in a direction from ends of the drain fingers connected to drain pads towards other ends, the stepwise side portions of the drain fingers corresponding to those of the source fingers; and gate electrodes that are provided, on the semiconductor substrate and have bent portions between steps formed in the stepwise side portions of the source fingers and steps formed in the stepwise side portions of the drain fingers, the gate electrodes being bent in the bent portions along the source fingers and the drain fingers, a shape of the stepwise side portion of one of the source fingers and that or the stepwise portion of a corresponding one of the drain fingers being symmetrical about a midpoint of an imaginary line that connects the other end of the one of the source fingers and the other end of the corresponding one of the drain fingers.

DETAILED DESCRIPTION

A description is now given of embodiments of the present invention with reference to the drawings.

First Embodiment

Figure 1:
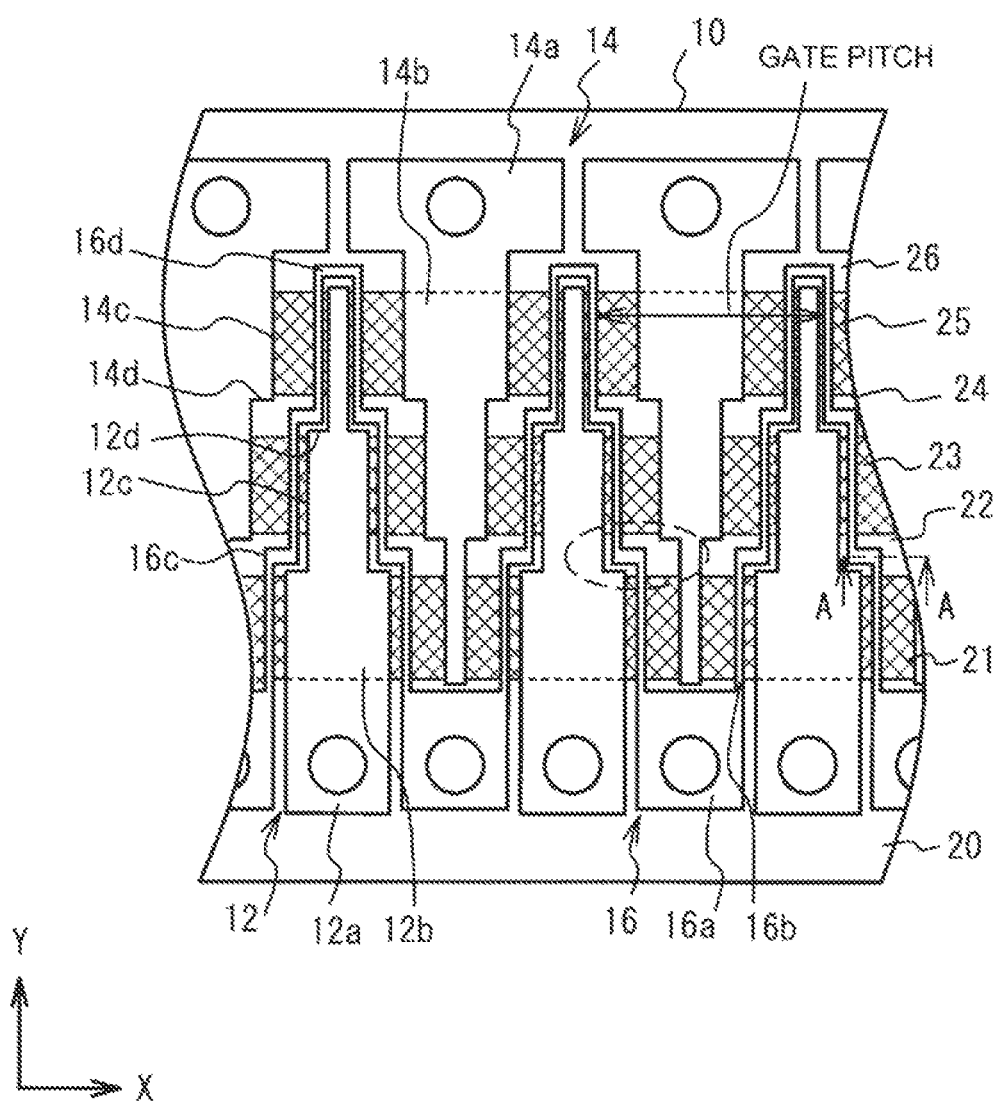
FIG. 1 is a plan view of a semiconductor device in accordance with a first embodiment.
Figure 2A:
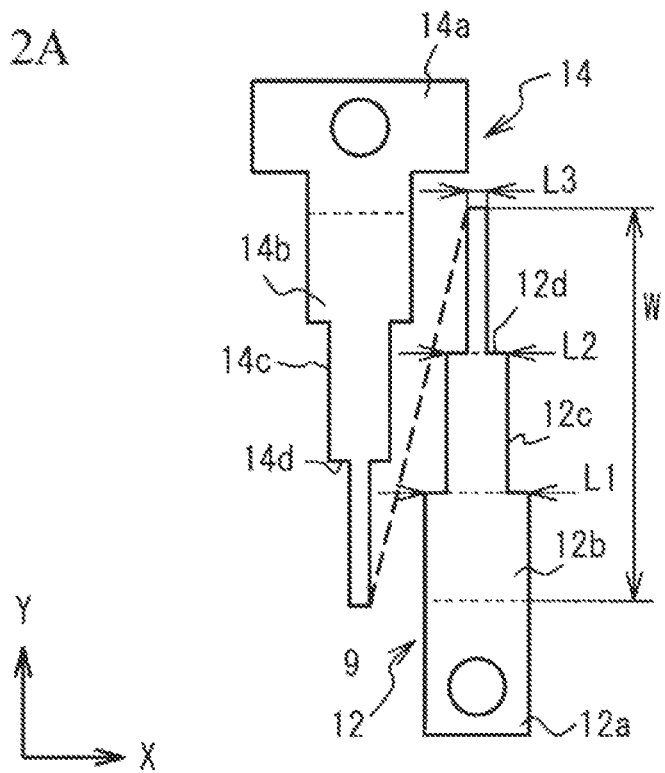
FIG. 2A illustrates a source electrode and a drain electrode used in the semiconductor device in FIG. 1.
Figure 2B:
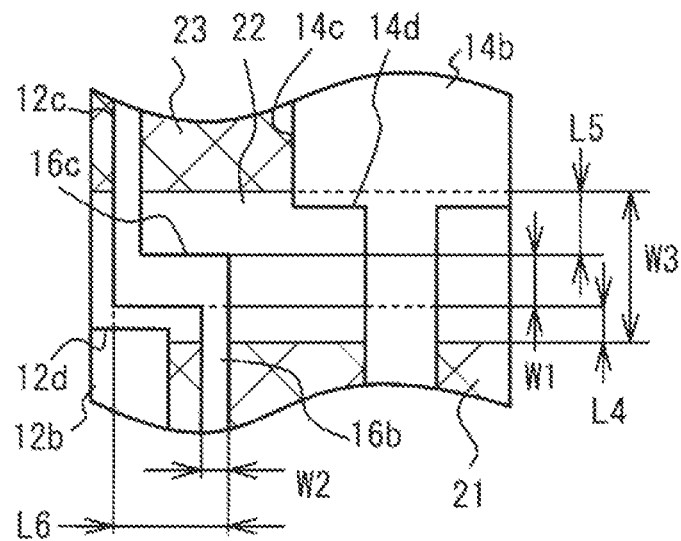
FIG. 2B is an enlarged view of a bent portion and its vicinity in the semiconductor device illustrated in FIG. 1.

FIG. 1 is a plan view of a semiconductor device in accordance with a first embodiment. FIG. 2A is a view of a source electrode and a drain electrode, and FIG. 2B is an enlarged view of a bent portion and its vicinity in FIG. 2A. An X direction in FIG. 1 is a gate length direction, and a Y direction is a gate width direction. FIG. 2A illustrates a pair of source electrode 12 and drain electrode 14 extracted from FIG. 1. FIG. 2B has an enlarged view of a portion surrounded by a dashed-line ellipse.

As illustrated in FIG. 1, a semiconductor device 100 of the first embodiment includes a semiconductor substrate 10, source electrodes 12, drain electrodes 14 and gate electrodes 16. The semiconductor substrate 10 may have a nitride semiconductor layer. As will be described later, the semiconductor substrate 10 may be formed by stacking a GaN (gallium nitride) layer on a substrate made of SiC (silicon carbide), for example, and stacking an n-type AlGaN (aluminum gallium nitride) on the GaN layer. The GaN layer functions as a channel layer. The n-AlGaN layer functions as an electron supply layer. Active regions and inactive regions are formed in the upper surface of the semiconductor substrate 10. In the active regions, the carriers move and current flows between the drain and source. In the inactive regions, the carrier do not move and current does not flow between the drain and source. The inactive regions may be formed by removing the channel layer or by making the channel layer inactive by ion implantation. In the semiconductor substrate 10, in the Y direction, there are formed, from the lower side of FIG. 1, an inactive region 20, an active region 21, an inactive region 22, an active region 23, an inactive region 24, an active region 25 and an inactive region 26. In FIG. 1, the active regions 21, 23 and 25 are illustrated with diagonal grids. The active regions 21, 23 and 25 have an identical width.

Each of the source electrodes 12 has a source pad 12a and a source finger 12b connected to the source pad 12a. The source finger 12b is a portion of the source electrode 12 extending upwards from a dotted line in FIG. 1. Each of the drain electrodes 14 has a drain pad 14a and a drain finger 14b connected to the drain pad 14a. The drain finger 14b is a portion of the drain electrode 14 extending downwards from a dotted line in FIG. 1. Each of the gate electrodes 16 has a gate pad 16a, a gate finger 16b and a bent portion 16c. Bonding areas of the source pads 12a, drain pads 14a and the gate pads 16a are illustrated as circles. The source pads 12a and the gate pads 16a are provided on the inactive region 20. The drain pads 14a are provided on the inactive region 26. The source pads 12a are provided along a side of the surface of the semiconductor substrate 10. The drain pads 14a are provided along another side of the surface of the semiconductor substrate 10 opposite to the above-described side along which the source pads 12a are provided. The gate pads 16a are provided closer to ends of the drain fingers 14b opposite to the ends having drain pads 14a. Voltages may be respectively applied to the source pads 12a, the drain pads 14a and the gate pads 16a. For example, the source pads 12a are grounded. A gate pitch indicated by an arrow will be described later.

As illustrated in FIGS. 1 and 2A, the length of the source fingers 12b in the gate-length direction (X direction) decreases stepwise from ends in which the source pads 12a are provided towards the other ends. In the words, the source fingers 12b have stepwise side portions 12c. More particularly, as illustrated in FIG. 2A the source fingers 12b have lengths L1, L2 and L3 in the decreasing order from the lower side in the Y direction (L1>L2>L3). A width W of the electrodes will be described later.

Like the source fingers 12b, the length of the drain fingers 14b in the gate-length direction decreases stepwise from ends in which the drain pads 14a are provided towards the other ends. In other words, the drain fingers 14b have stepwise side portions 14c, which are correspond to or a counterpart to the side portions 12c. Each of the source fingers 12b and the drain fingers 14b has a width that makes it possible to function as an electrode. The source fingers 12b and the drain fingers 14b may be made of an identical material and may have an identical thickness. The lengths of the source fingers 12b and the lengths of the drain fingers 14b are those measured in the gate-length direction (X direction in FIG. 1).

As illustrated in FIG. 2A, the shape of the side portion 12c of the source finger 12b and the shape of the side portion 14c of the corresponding drain finger 14b are symmetrical about the midpoint of an imaginary line 9 (dashed line) that connects the other end of source finger 12b and the other end of the drain finger 14b. Thus, the sum of the length of the source finger 12b and that of the drain finger 14b is constant in the Y direction. Thus, the sum of currents that respectively flow through the source finger 12b and the drain finger 14b is also constant over the Y direction.

As illustrated in FIG. 1, the gate fingers 16b are connected to the corresponding gate pads 16a, and are provided on the active regions 21, 23 and 25. The bent portions 16c of each of the gate fingers 16b are respectively provided on the inactive regions 22 and 24, and do not contact the active regions 21, 23 and 25. Each of the bent portions 16c connects two finger portions of the gate finger 16b extending in the Y direction. Each of the bent portions 16c is arranged between a step 12d formed in the side portion 12c of the source finger 12b and a step 14d formed in the side portion 14c of the drain finger 14b. That is, the gate electrode 16 is bent in the bent portions 16c so as to extend along the source finger 12b and the drain finger 14b. Exemplary dimensions are described. As illustrated in FIG. 2B, a line width W1 of the bent portion 16c may be not less than 1 μm, and may be greater than a line width W2 of the gate finger 16b. A line width W3 of the inactive region 22 may be not less than 4 μm, and a distance L4 between the bent portion 16c and the active region 21 may be not less than 2 μm. A distance 155 between the bent portion 16c and the active region 23 may be not less than 1 μm. In order to increase the gate-drain breakdown voltage, the distance between the bent portion 16c and the active region closer to the drain electrode 14 is preferably longer than the distance between the bent portion 16c and the active region closer to the source electrode 12. A length L6 of the bent portion 16c will be described later.

As illustrated in FIG. 1, joining portions 16d are provided on the inactive regions 26 and interconnect the adjacent gate electrodes 16. In other words, the adjacent gate electrodes 16 provided at both sides of the source electrode 12 are connected together, and the adjacent gate electrodes 16 provided at both sides of the drain electrode 14 are connected together. In order to reduce the source resistance, the distance between the gate electrode 16 and the source electrode 12 is preferably shorter than that between the gate electrode 16 and the drain electrode 14. The gate-drain breakdown voltage may be improved by increasing the distance between the gate electrode 16 and the drain electrode 14.

The source fingers 12b and the drain fingers 14b may be formed by stacking metals of, for example, Ti/Al/Au or Ta/Al/Au in this order so that the leftmost, metal (Ti or Ta) is closest, to the semiconductor substrate 10. The combination of Ti/Au or Ta/Au form an ohmic electrode. The Au layer, which functions as an interconnection, is formed on the ohmic electrode by plating. The Au layer is thicker than the ohmic electrode and enables a flow of a large amount of current. The gate electrodes 16 may be formed by stacking metals of, for example, Ni/Au in this order so that Ni is closer to the semiconductor substrate 10. The portions of the gate electrodes 16 on the inactive regions, namely, the bent portions 16c and the joining portions 16d may be formed by an identical metal layer such as an Au layer.

The output power of the semiconductor device is now described. The output power of the semiconductor device depends on the finger width W (see FIG. 2A) and the number of gate electrodes 16 (the number of gates). An increased finger width W or an increased number of gate electrodes 16 increases the currents that flow through the source fingers 12a and the drain fingers 14b and results in higher output power.

In order to secure the reliability of the semiconductor device, currents that flow through the source electrodes 12 or the drain electrodes 14 are required to be not greater than a tolerable current. The tolerable current may be defined by multiplying the tolerable current density to the cross section of the finger such as the source fingers 12b and the drain fingers 14b. An increased size of electrodes leads to an increased size of the semiconductor device.

In the semiconductor device 100 of the first embodiment, each of the source electrodes 12 includes the source finger 12b that is stepwise changed from the ends to which the source pads 12a are connected towards the other ends so that the finger length in the gate-length direction decreases stepwise. Similarly, each of the drain electrodes 14 includes the drain finger 14b that is stepwise changed from the ends to which the drain pads 14a are connected towards the other ends so that the finger length in the gate-length direction decreases stepwise. Thus, the source fingers 12b and the drain fingers 14b may have increased tolerable currents, which increase the output power of the semiconductor device.

The side portions 14c of the drain fingers 14b correspond to the side portions 12c of the source fingers 12b. The shape of the side portion 12c of the source finger 12b and the shape of the side portion 14c of the drain finger 14b facing the source finger 12b are symmetrical about the midpoint of the imaginary line that connects the other end of the source finger 12b and the other end of the drain finger 14b. Thus, the sum of the current that flows through the source finger 12b and the current that flows through the drain finger 14b is constant over the Y direction illustrated in FIGS. 1 and 2A. Thus, the characteristics of the semiconductor device are stabilized.

Since the source finger 12b and the drain finger 14b are symmetrical, the end of the source finger 12b having a comparatively long length is adjacent to the other end of the drain finger 14b having a comparatively short length. Similarly, the end of the drain finger 14b having a comparatively long length is adjacent to the end of the source finger 12b having a comparatively short length. It is thus possible to suppress increasing in size of the semiconductor device. Particularly, the side portion 12c and the side portion 14c correspond to each other, and the gate electrode 16 is bent. It is thus possible to effectively suppress increasing in size of the semiconductor device. A description is now given of the size of the semiconductor device in a case where the number of source fingers 12b and that of drain fingers 14b are changed.

Figure 3:
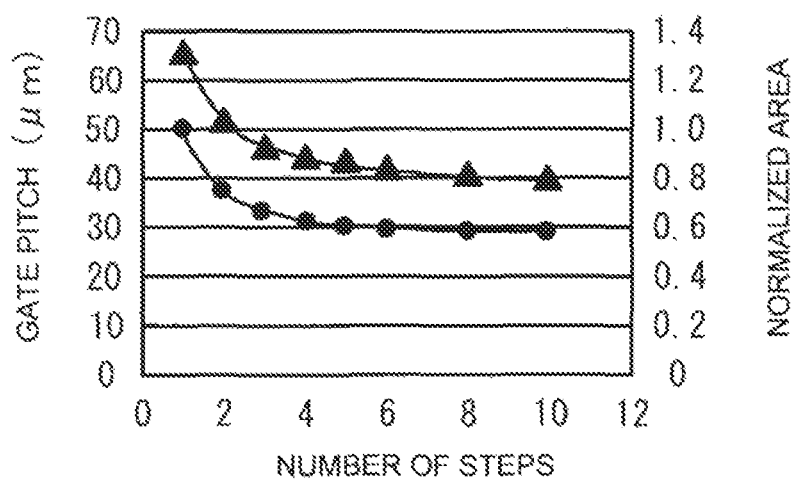
FIG. 3 is a graph that illustrates a relationship between the number of steps and a gate pitch.

FIG. 3 is a graph that shows a relationship between the number of steps of fingers and the gate pitch and a relationship between the number of steps of fingers and the area of the semiconductor device. The horizontal axis is the number of steps of fingers, the left vertical axis is the gate pitch (μm), and the right vertical axis is the area of the semiconductor device. Triangles indicate the gate pitches, and the circles indicate the areas. The gate pitch is the length indicated by the arrow in FIG. 1A. The area on the left vertical axis is defined by normalizing the area of the semiconductor device by an area occupied when the number of steps is one. It is assumed that the line width W2 of the gate fingers 16b is 600 μm, the number of gate electrodes is 72, and the length L6 of the bent portions 16c is 11.5 μm (see FIG. 2B).

As illustrated in FIG. 3, as the number of steps increases, the gate pitch and the area reduce. Both the crate pitch and the area may be reduced by approximately 40% by increasing the number of steps to four from one where the source fingers 12b and the drain fingers 14b do not have any stepwise side portion. As the number of steps increases, the semiconductor device may be downsized. A tolerable current density as high as $6 \times 10^5$ A/cm$^2$ is realized, because of the enlarged source finger 12b and drain finger 14b.

A compound semiconductor layer such as a nitride semiconductor layer or a GaAs based semiconductor layer may have a crystal orientation. In this case, the resistance to etching and the flow of current may have an orientation dependence. Thus, in an etching process for forming electrodes, the degree of progress of etching may have an orientation dependence, which may vary the shape of the semiconductor layer. A varied shape of the semiconductor layer may cause leakage of current or a break of the semiconductor layer. If the thickness of the electrode varies on the active region, the magnitude of current may have an orientation dependence, which may cause leakage of current or a break of the semiconductor layer.

The step portions 12d and 14d are arranged on the inactive regions 22 and 21. The bent portions 16c of the gate electrodes 16 are also arranged on the inactive regions 22 and 24. That is, the portions of the source electrodes 12 and the drain electrodes 14 having thicknesses from those of the other portions are arranged on the inactive regions. It is thus possible to suppress leakage of current and a break of the semiconductor layer.

In the first embodiment, the gate electrodes 16 are connected in the end portions and the bent portions 16c. The active regions 21, 23 and 25 have the same width. Thus, almost the same currents flow through the active regions, and the semiconductor device may have little degradation of the characteristics.

Figure 4A:
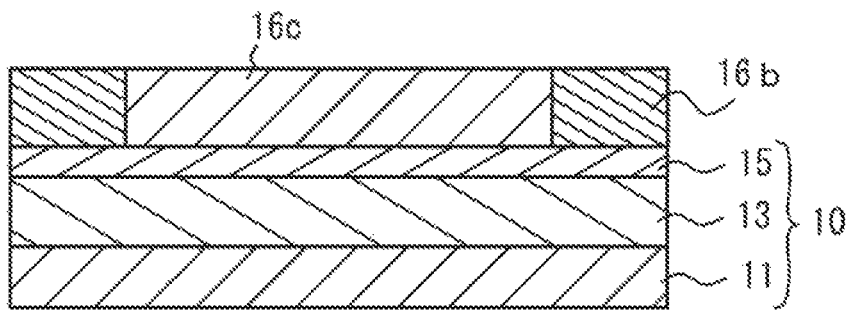
FIGS. 4A through 4C are respectively cross-sectional views of a bent portion and its vicinity.
Figure 4B:
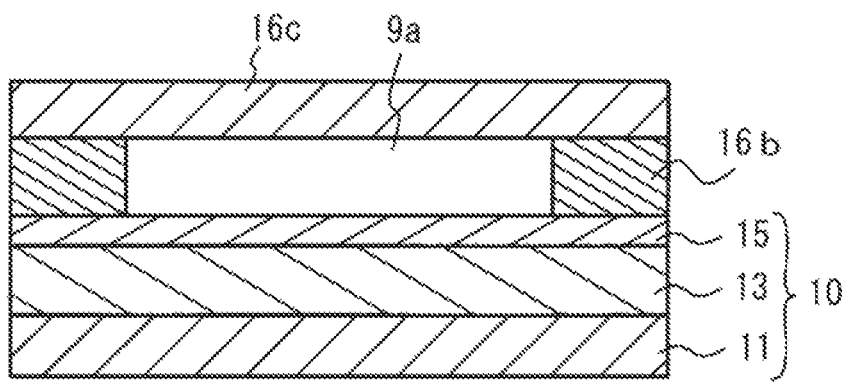
Figure 4C:
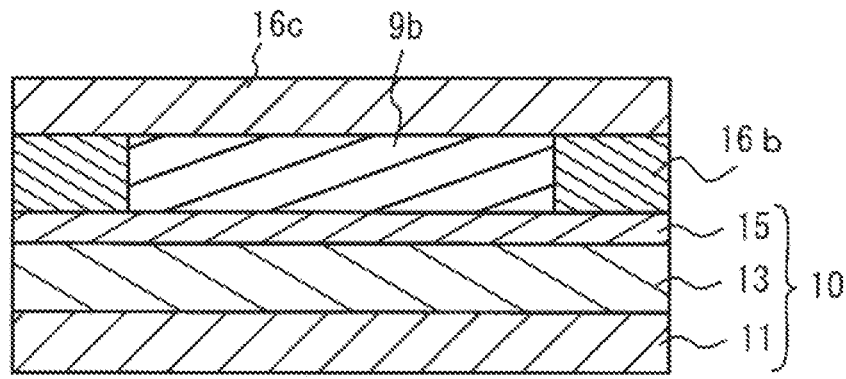

Examples of the bent portions 16c of the gate electrodes 16 are now described. FIGS. 4A through 4C are cross-sectional views of the bent portions 16c and their vicinities, and correspond to cross sections taken along the line A-A in FIG. 1.

As illustrated in FIGS. 4A and 4B, the semiconductor substrate 10 is formed by stacking a substrate 11, a GaN layer 13, and n-AlGaN layer 15 in this order from the bottom. The substrate 11 may be Si, SiC (silicon carbide), or sapphire. The GaN layer 13 and the n-AlGaN layer 15 may be layers formed by other nitride semiconductors. The nitride semiconductors are semiconductors including nitrogen, and include InN (indium nitride), AlN (aluminum nitride), InGaN (indium gallium nitride), InAlN (indium aluminum nitride) and AlInGa (aluminum indium gallium nitride). Semiconductors including GaAs may be used. Examples of those semiconductors include GaAs (gallium arsenide), AlAs (aluminum arsenide), InAs (indium arsenide), InGaAs (indium gallium arsenide), AlGaAs (aluminum gallium arsenide), and AlInGaAs (aluminum indium gallium arsenide).

As illustrated in FIG. 4A, the gate fingers 16b and the bent portion 16c are provided on the n-AlGaN layer 15 so as to contact the n-AlGaN layer 15. The bent portion 16c is made of the same maternal as the gate fingers 16b. As shown in FIG. 4B, a recess 9a is formed on the inactive region and the bent portion 16c is provided over the recess 9a. As illustrated in FIG. 4C, an insulation layer 9b made of, for example, SiO$_2$ or SiN is provided on the inactive region, and the bent portion 16c is provided on the insulation layer 9b.

Second Embodiment

Figure 5A:
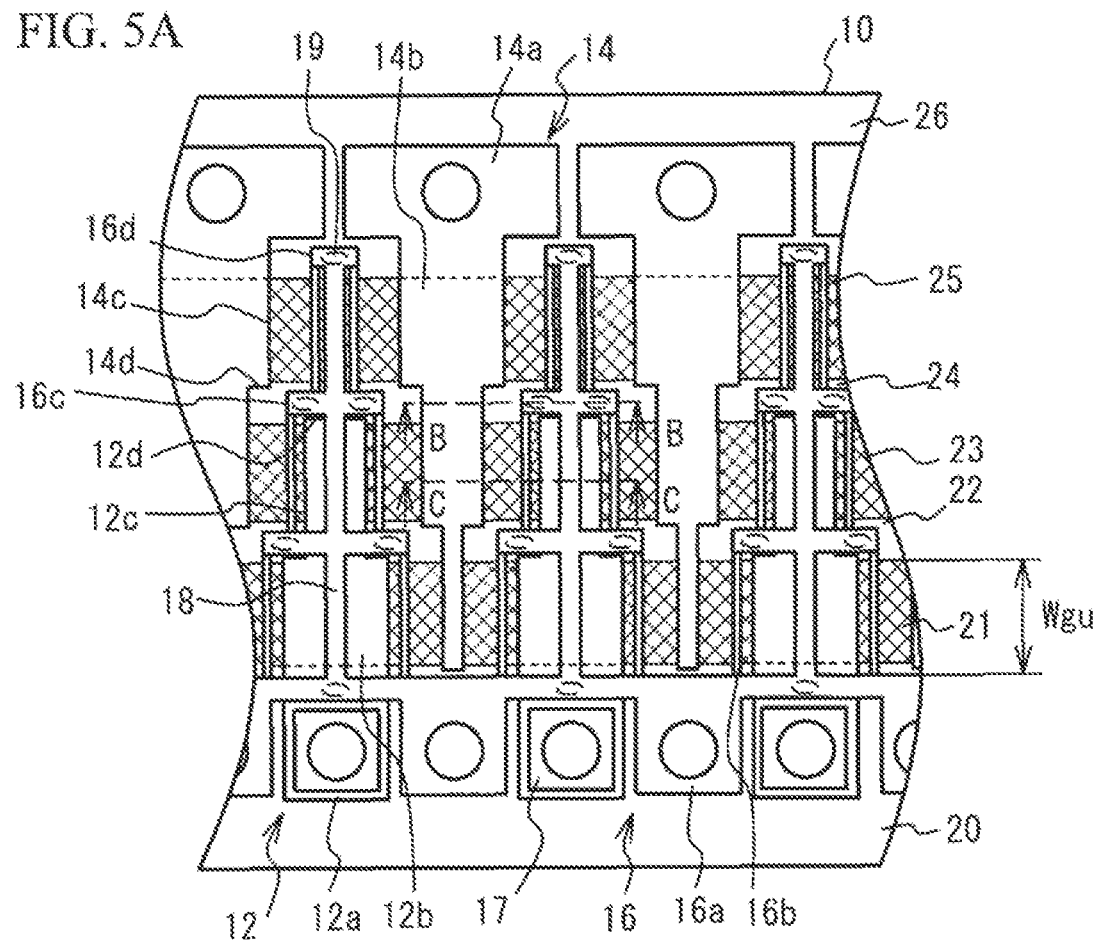
FIG. 5A is a plan view of a semiconductor device, in accordance with a second embodiment.
Figure 5B:
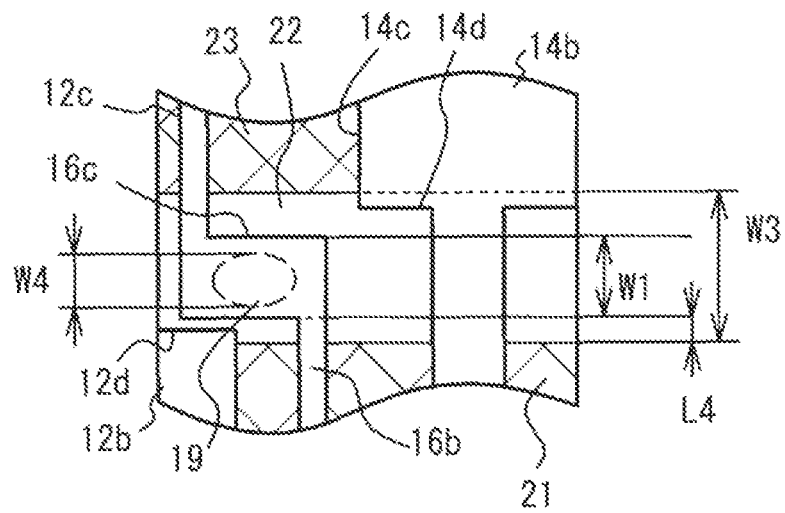
FIG. 5B is an enlarged view of a bent portion and its vicinity in the semiconductor device illustrated in FIG. 5A.
Figure 6A:
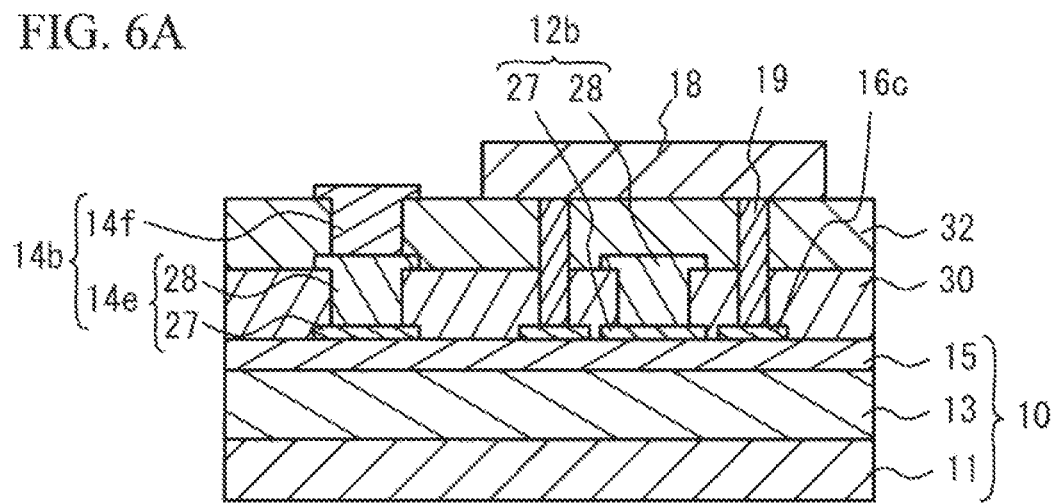
FIGS. 6A and 6B are respectively cross-sectional views of the semiconductor device in accordance with the second embodiment.
Figure 6B:
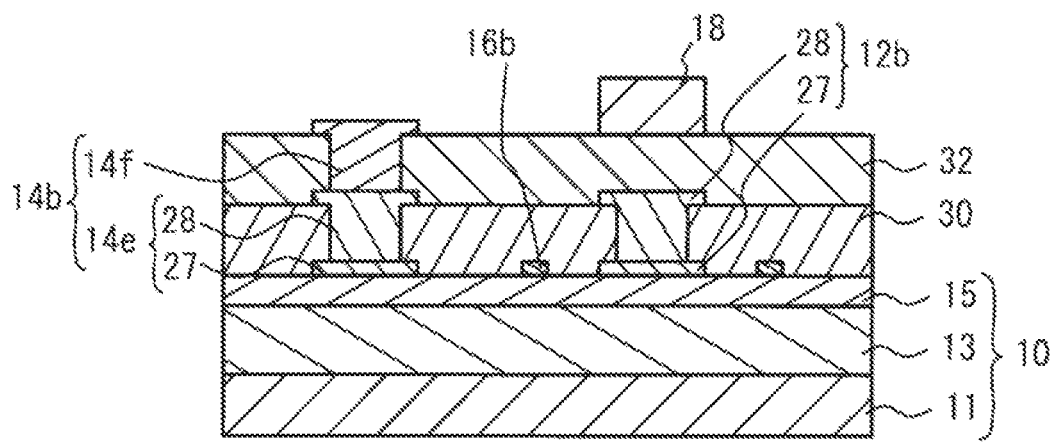

A second embodiment is an exemplary semiconductor device with an interconnection that connects the adjacent gate electrodes together. FIG. 5A is a plan view of a semiconductor device 200 in accordance with the second embodiment, and FIG. 5B is an enlarged view of a bent portion. The bent portion in FIG. 5B corresponds to the bent portion in FIG. 2A, and is seen through the interconnection 18, FIG. 6A is a cross-sectional view taken along a line B-B in FIG. 5A, and FIG. 6B is a cross-sectional view taken along a line C-C in FIG. 5A. A repetitive description is not given of structures of the semiconductor device 200 that are the same as those that have been described.

As illustrated in FIGS. 5A and 6A, the interconnections 18 are provided above portions of the gate electrodes 16 in the inactive region 20, above the bent portions 16c and the joining portions 16d, and above the source electrodes 12. As illustrated by dashed ellipses in FIGS. 5A and 5B, the interconnections 18 are connected to the gate electrodes 16 by via interconnections 19 in the bent portions 16c and the joining portions 16d. The gate pads 16a are connected to the interconnections 18 close to the periphery of the semiconductor substrate 10 and are located on the inactive region 20. The width of the gate electrode 16 between the two bent portions 16c is equal to the width of the gate electrode 16 between the end portion and the bent portion 16c.

As illustrated in FIG. 5A, the source electrodes 12 have metal layers 17 in the areas in which the source pads 12a are formed. The metal layers 17 and the interconnections 18 may be made of Au, for example, and may be identical metal layers. Thus, the source pads 12a and the gate pads 16a have almost same heights, which make it easy to connect terminals to these pads from the outside of the semiconductor device.

As illustrated in FIG. 5B, the width W1 of the bent portion 16c may be not less than 3 µm, for example. A width W4 of the via interconnection 19 may be not less than 2 µm, for example, The via interconnection 19 may be 0.5 µm away from the upper and lower ends of the bent portion 16c. The width W3 of the inactive region 22 may be not less than 6 µm, for example.

As illustrated in FIG. 6A, insulation layers 30 and 32 made of an insulator such as $SiO_2$ or SiN are provided between the interconnection 18 and the semiconductor substrate 10. The source finger 12b passes through the insulation layer 30. The insulation layer 32 is provided between the interconnection 18 and the source finger 12b, which is thus isolated from the interconnection 18 and the source finger 12b. The interconnection 18 is connected to the two bent portions 16c located at both sides of the source finger 12b by the via interconnection 19 passing through the insulation layers 30 and 32. The interconnection 18 connects the adjacent gate electrodes 16 together. As illustrated in FIG. 6B, the interconnection 18 is not connected to any portion other than the bent portions 16c of the gate electrodes 16. The width of the interconnection 18 above the source finger 12b is greater than the width of the gate finger 16b.

As illustrated in FIGS. 6A and 6B, the drain finger 14b is composed of a first layer 14e and a second layer 14f. The first layer pierces the insulation layer 30. The second layer 14f contacts the top of the first layer 14e and pierces the insulation layer 32. The source finger 12b and the first layer 14e may be formed by stacking a Ti layer 27 and an Al layer 28 in this order (Ti/Al) from the side closer to the semiconductor substrate 10. The first layer 14e may be formed by stacking metals of Ta and Al (Ta/Al). The second layer 14f may be made of a metal such as Au. The drain finger 14b used in the second embodiment is thicker than the drain finger 14b used in the first embodiment.

According to the second embodiment, the gate electrodes 16 are connected to the interconnection 18 and have a reduced resistance. Thus, the signal loss is reduced and the characteristics of the semiconductor device are improved. The drain fingers 14b has a thickness that passe through the insulation layers 30 and 32, and the drain electrodes 14 have a reduced resistance. The life of the semiconductor device depends on the current density. According to the second embodiment, the current density of the gate electrodes 16 and that of the drain electrodes 14 can be reduced. Thus, the semiconductor device has a reduced load and improved reliability.

A description is now given of a simulation that verifies the gain of the semiconductor device of the second embodiment. The simulation uses the equivalent circuit of the semiconductor device illustrated in FIG. 5A for calculating the gain thereof.

The simulation of the semiconductor device illustrated in FIG. 5A has a step of changing the number of connecting points at which one gate electrode 16 is connected to the interconnections 18. More particularly, the simulation has a step of changing the number of connecting points at which one gate electrode 16 is connected to the interconnections 18 between the active region 21 and the active region 25. An increased number of connecting points reduces a unit gate width Wgu. In the simulation, the unit gate width Wgu is defined as the width of the gate finger 16b that is interposed between the bent portions 16c and is measured in the Y direction (see FIG. 5A). The resistance of the gate electrode 16 (gate resistance) depends to the unit gate width. That is, the simulation changes the unit gate width by changing the number of connecting points and calculates the gain Gamax of the semiconductor device for change in gate resistance.

The simulation uses a reference gain that is the gain. Gamax obtained by setting the unit gate width Wgu equal to 400 µm and setting the number of gate electrodes 16 the number of gates) to 10. These parameter values are selected taking into account a chip size used in base stations in communication systems. The simulation calculates a change ΔGamax in the gain Gamax while changing the unit gate width. Wgu. Samples used in the simulation are as follows.

The gain Gamax is calculated using the equivalent circuit of the semiconductor device. The source electrodes 12, the drain electrodes 14, and the gate electrodes 16 have multilayer structures including an Au layer having a thickness of 400 µm. The width W2 of the gate fingers 16b is 0.6 µm (see FIG. 2B), and the unit gate width F is 400 µm (see FIG. 2A). The gate resistance increases in proportion to the unit gate width W according the Ohm's law. This has been confirmed by the TEG (Test Element Group) evaluation. In the present analysis, a relationship between the unit gate width W and the gain is calculated by using, as a reference, parameters and gain of an equivalent circuit of a device having 10 gate electrodes 16 each having a unit gate width Wgu of 400 µm.

Figure 7:
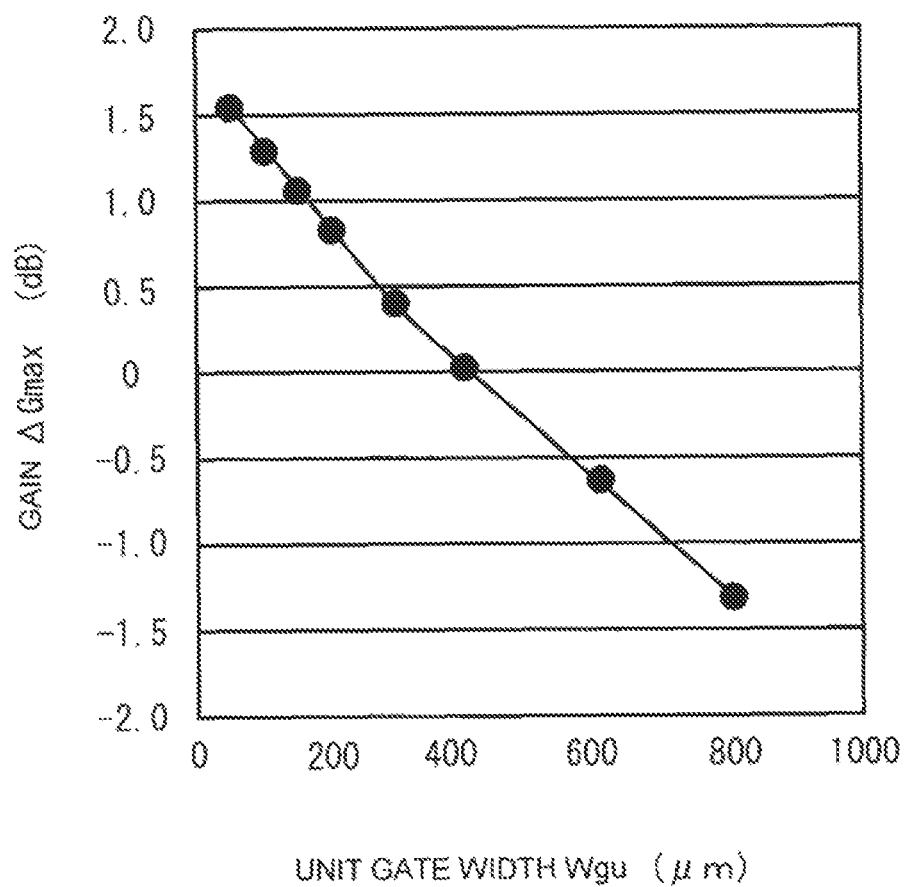
FIG. 7 is a graph of a relationship between the gain and the unit gate width.

FIG. 7 illustrates results of the simulation. The horizontal axis denotes the unit gate width Wgu, and the vertical axis denotes the difference ΔGamax in gain from the reference.

As illustrated in FIG. 7, the gain Gamax of the semiconductor device increases by decreasing the unit gate width from the reference of 400 µm. That is, the gain of the semiconductor device increases by increasing the number of connecting points. For example, when the number of connecting points is only 1, the gate width between the connecting points is 200 µm, and the gain is improved by 0.8 dB. For three connecting points, the gate width is 100 µm, and the gain is improved by 1.3 dB. For seven connecting points, the gate width is 50 µm and the gain is improved by 1.5 dB. As the number of connecting points increases, the gate width between the connecting points decreases and the resistance also decreases.

As described above, the use of the interconnection 18 that interconnects the adjacent gate electrodes 16 decreases the gate resistance and improves the gain of the semiconductor device. An increased number of connecting points for connecting the interconnection 18 to the gate electrodes 16 further improves the gain of the semiconductor device.

The interconnections 18 may be provided above the drain fingers 14b. However, it is preferable to provide the interconnections 18 above the source fingers 12b in order to reduce the parasitic capacitance formed between the gate and the drain.

Third Embodiment

Figure 8A:
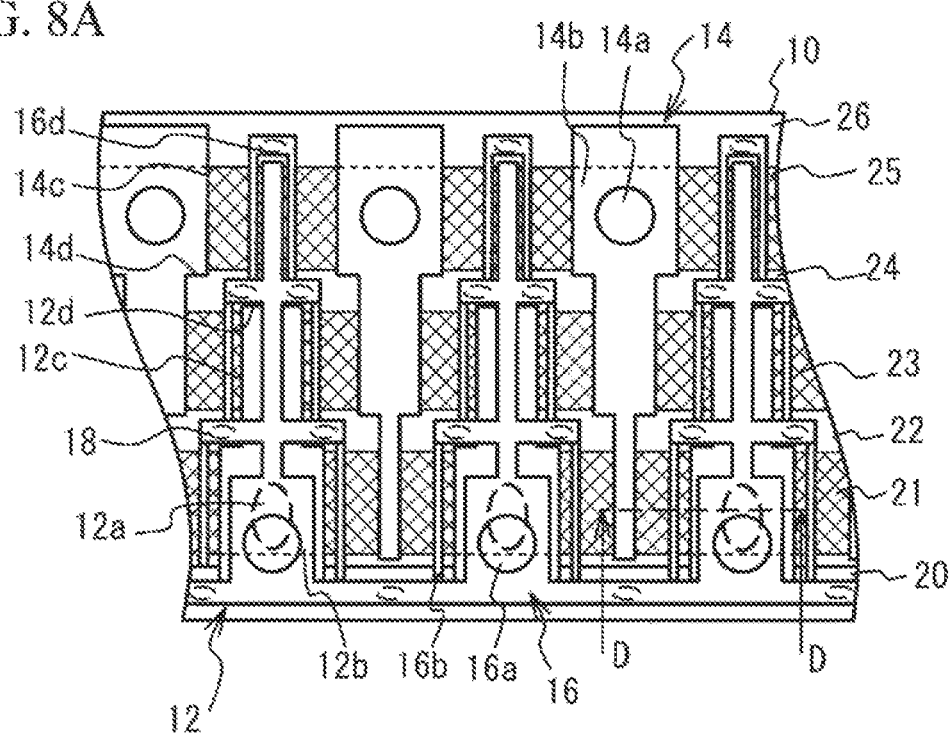
FIG. 8A is a plan view of a semiconductor device in accordance with a third embodiment.
Figure 8B:
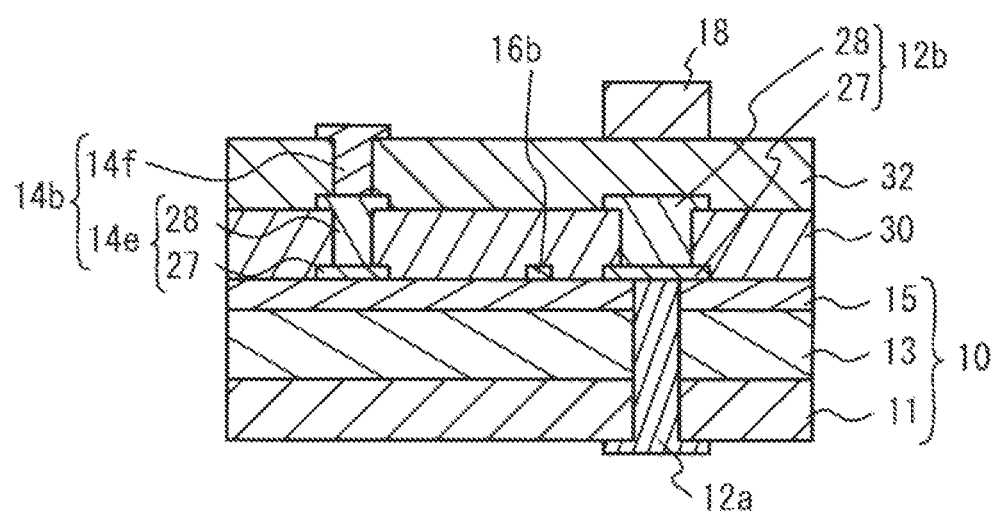
FIG. 8B is a cross-sectional view taken along a line D-D in FIG. 8A.

A third embodiment is an exemplary semiconductor directed to downsizing by changing the positions of the pads. FIG. 8A is a plan view of a semiconductor device 300 in accordance with the third embodiment, and FIG. 8B is a cross-sectional view taken along a line D-D in FIG. 8A. Parts of the semiconductor device 300 that are the same as those of the aforementioned semiconductor devices that have been described are not described here.

As illustrated in FIG. 8A, the source pads 12a are provided in longest finger portions of the source fingers 12b. The drain pads 14a are provided in longest finger portions of the drain fingers 14b. The source pads 12a are provided on the active regions 21, and the drain pads 14a are provided on the active regions 25. Each of the source pads 12a and the drain pads 14a is formed between the two corresponding gate fingers 16b. The gate pads 16a are provided on the interconnections 18 and are provided in the longest, finger portions of the source fingers 12b.

As illustrated in FIGS. 8A and 8B, the source pads 12a include via holes that pass through the semiconductor substrate 10. Electrodes made of a metal such as Au are formed in the via holes.

According to the third embodiment, the source pads 12a are provided in the longest finger portions of the source fingers 12b, and the drain pads 14a are provided in the longest finger portions of the drain fingers 14b, while one source pad 12a and one drain pad 14a are Provided between the two gate electrodes 16. Thus, it is possible to downsize the inactive regions 20 and 26 and to realize a downsized semiconductor device. Heat generated by the operation of the semiconductor device is radiated in areas from the inactive region 20 to the inactive region 26. According to the third embodiment, the hear radiating area may be widened and the thermal resistance may be reduced.

Since the source pads 12a pass through the semiconductor substrate 10, the source pads 12a may be provided in the longest finger portions of the source fingers 12b without contacting the source electrodes 12. Thus, the semiconductor device may be further downsized. The drain pads 14a may be arranged on the inactive region 26 like the example illustrated in FIG. 1. However, in terms of downsizing, it is preferable to provide the drain pads 14a in the longest finger portions of the drain fingers 14b. The drain pads 14a may pass through the semiconductor substrate 10, and the gate pads 16a may be provided in the longest finger portions of the drain fingers 14b. That is, at least each source pad 12a or each drain pad 14a is provided between the two corresponding gate electrodes 16 and passes through the semiconductor substrate 10.

Fourth Embodiment

Figure 9:
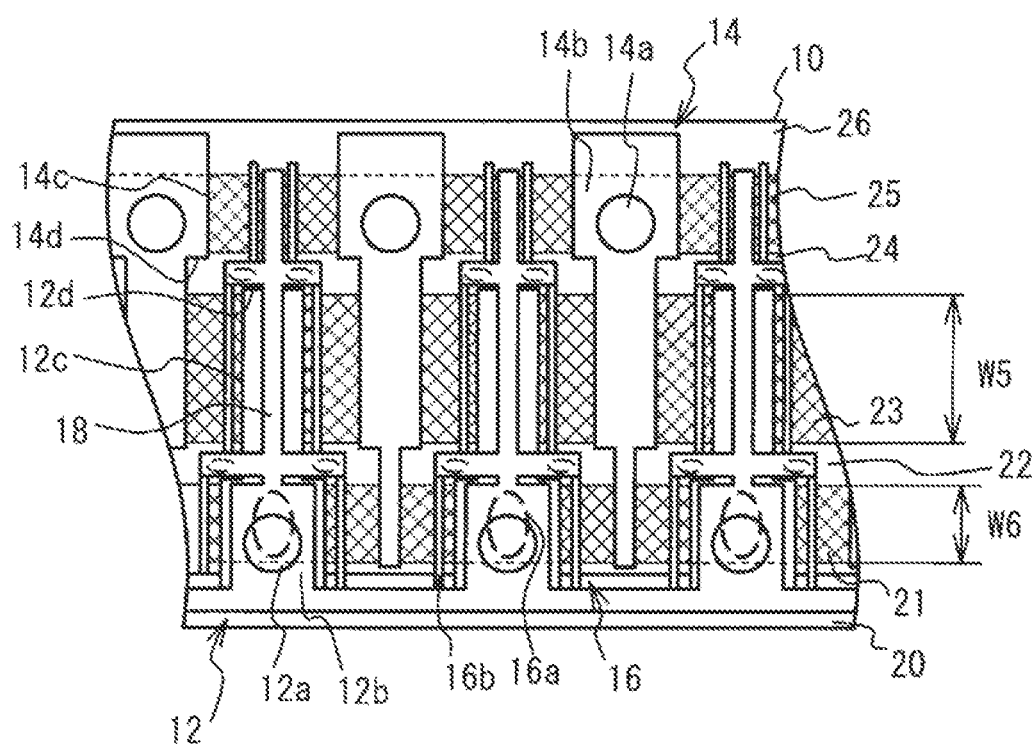
FIG. 9 is a plan view of a semiconductor device in accordance with a fourth embodiment.

A fourth embodiment is an exemplary semiconductor device in which the widths of the gate fingers 16b are changed. FIG. 9 is a plan view of a semiconductor device 400 in accordance with the fourth embodiment, in which parts that are the same as those that have been described previously are not described here.

Referring to FIG. 9, the gate electrodes 16 do not have the joining portions 16d. That is, the two adjacent gate electrodes 16 are not interconnected in the end portions. Each of the interconnections 18 interconnects the two gate electrodes 16 in the bent portions 16c.

A width W5 of the active regions 23 is greater than a width S6 of the active regions 21. The active regions 21 and the active regions 25 have an identical width. That is, the width W5 of the gate fingers 16b on the active regions 23 is greater than the width of the gate fingers 16b on the active regions 21 and the width of the gate fingers 16b on the active regions 25. More particularly, W5 may be twice the width W6.

Since the two gate electrodes 16 are not connected together in the end portions, it is possible to reduce the parasitic capacitance between the gate electrode 16 and the drain electrode 14. A reduced gate-drain parasitic capacitance improves the characteristics of the semi conductor device. For example, a reduced gate-drain parasitic capacitance may stabilize the operation of the semiconductor device and may suppress decrease in gain.

The arrangement in which the two gate electrodes 16 are not interconnected in the end portions but are interconnected in the bent portions 16c makes the currents flowing through the active regions 21 and 25 smaller than the current flowing through the active region 23. In the fourth embodiment, the width 215 of the active region 23 is greater than the width 216 of the active regions 21 and 25. In other words, the width of the gate electrode 16 between the two bent portions 16c is greater than the width of the gate electrode 16 between the end portion and the bent portion 16c. Thus, it is possible to increase the current flowing through the gate finger 16b on the active region 23 and make almost the same currents to flow through the active regions 21, 23 and 25. It is thus possible to suppress degradation of the characteristics of the semiconductor device.

The fourth embodiment is configured to reduce the parasitic capacitance between the gate and the drain and to thus improve the characteristics of the semiconductor device and cause almost the same currents to flow through the gate electrodes 16 in the respective active regions.

Fifth Embodiment

Figure 10:
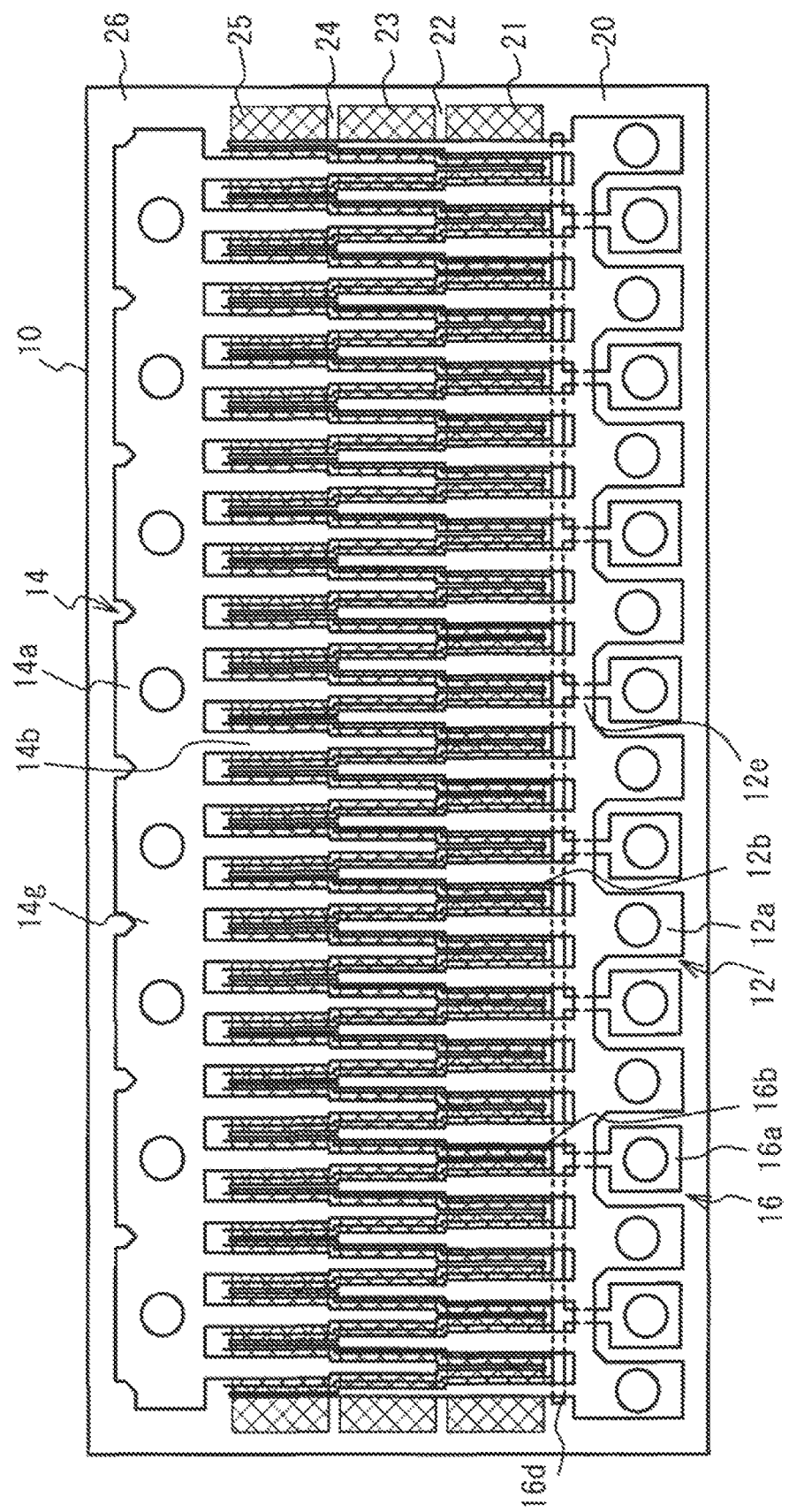
FIG. 10 is a plan view of a semiconductor device in accordance with a fifth embodiment.

A fifth embodiment is an exemplary semiconductor device in which the electrodes are arranged in the form of a tooth comb. FIG. 10 is a plan view of a semiconductor device in accordance with the fifth embodiment. An enlarged view of one bent portion 16c and its vicinity is the same as illustrated in FIG. 2A.

As illustrated in FIG. 10, the source electrodes 12, the drain electrodes 14 and the gate electrodes 16 are provided on the upper surface of the semiconductor substrate 10 in the form of a tooth comb. More particularly, the source electrodes 12 and the drain electrodes 14 are alternately arranged, and one gate electrode 16 is interposed between a pair of source electrode 12 and drain electrode 14.

Three source fingers 12b are provided for one source pad 12a. The adjacent source pads 12a are interconnected by a joining portion 12e. That is, the adjacent source electrodes 12 are connected together. The joining portion 12e is provided on the inactive region 20 and is interposed between the source pad 12a and the source fingers 12b.

Three drain fingers 14b are provided for one drain pad 14a. The adjacent drain pads 14a are interconnected by a joining portion 14g. That is, the adjacent drain electrodes 14 are connected together. The joining portion 14g is provided on the inactive region 26 and is interposed between the drain pad 14a and the drain fingers 14b.

Two gate fingers 16b are provided for one gate pad 16a. The adjacent gate pads 16a are interconnected by a joining portion 16d. That is, the adjacent gate pads 16a are connected together. The joining portion 16d is provided on the inactive region 20 in the semiconductor substrate 10 and is interposed between the gate pad 16a and the gate fingers 16b.

The source pads 12a and the gate pads 16a are provided on the inactive region 20. One gate pad 16a is provided between the two source pads 12a. The drain pads 14a are provided in the inactive region 26. In other words, the source pads 12a are arranged along a side of the upper surface of the semiconductor substrate 10, and the drain pads 14a are arranged along the opposite side of the upper surface of the semiconductor substrate 10. Each of the two source fingers 12b located along the short sides of the semiconductor substrate 10 is associated with the next drain finger 14b is formed to have a straight side closer to the short side of the semiconductor substrate 10. Thus, the semiconductor device may be downsized.

According to the fifth embodiment, even when the electrodes are arranged in the form of tooth comb, the tolerable currents that flow through the electrodes may be increased and the semiconductor device may have a higher output power.

Sixth Embodiment

Figure 11:
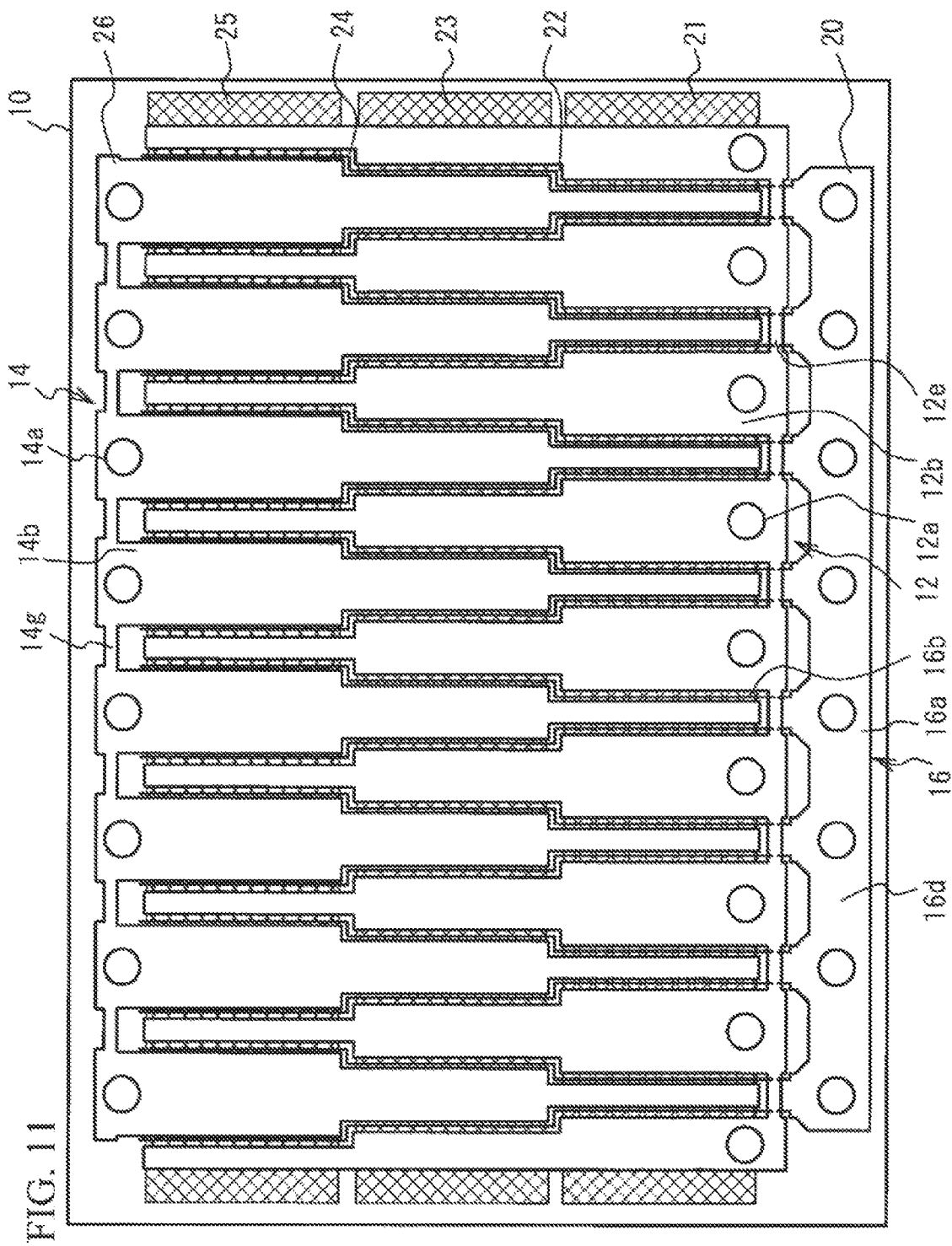
FIG. 11 is a plan view of a semiconductor device in accordance with a sixth embodiment.

A sixth embodiment is an exemplary semiconductor device having a variation of the structures of the electrodes employed in the fifth embodiment. FIG. 11 is a plan view of a semiconductor device in accordance with the sixth embodiment.

Referring to FIG. 11, the source pads 12a are provided in the longest, finger portions of the source fingers 12b. The drain pads 14a are provided in the longest finger portions of the drain fingers 14b.

According to the sixth embodiment, like the fifth embodiment, even when the electrodes are arranged in the form of tooth comb, the tolerable currents that flow through the electrodes may be increased and the semiconductor device may have a higher output power. Further, like the third embodiment, the arrangements of the source pads 12a and the drain pads 14a in the respective longest finger portions may downsize the semiconductor device and reduce the thermal resistance.

The present invention is not limited to the specifically described embodiments, but other embodiments and variations may be made without departing from the scope of the present invention.

What is claimed is:

1. A semiconductor device comprising:
   source electrodes that are provided on a semiconductor substrate and are having source fingers, the source fingers having stepwise side portions so that a length of the source fingers in a gate length direction decreases stepwise in a direction from ends of the source fingers connected to source pads towards other ends;
   drain electrodes that are provided on the semiconductor substrate and are having drain fingers, the drain fingers having stepwise side portions so that a length of the drain fingers in the gate length direction decreases stepwise in a direction from ends of the drain fingers connected to drain pads towards other ends, the stepwise side portions of the drain fingers corresponding to those of the source fingers; and
   gate electrodes that are provided on the semiconductor substrate and have bent portions between steps formed in the stepwise side portions of the source fingers and steps formed in the stepwise side portions of the drain fingers, the gate electrodes being bent in the bent portions along the source fingers and the drain fingers,
   a shape of the stepwise side portion of one of the source fingers and that of the stepwise portion of a corresponding one of the drain fingers being symmetrical about a midpoint of an imaginary line, that connects the other end of the one of the source fingers and the other end of the corresponding one of the drain fingers.

2. The semiconductor device according to claim 1, wherein the bent portions of the gate electrodes are provided on inactive regions formed in the semiconductor substrate and do not contact active regions formed in the semiconductor substrate.

3. The semiconductor device according to claim 1, wherein:
   the gate electrodes are provided at both sides of at least, the source fingers or the drain fingers; and
   the semiconductor device further comprises interconnections provided on at least the source fingers or the drain fingers and interconnect adjacent ones of the gate electrodes in the bent portions.

4. The semiconductor device according to claim 1, wherein:
   the semiconductor substrate having a nitride semiconductor layer.

5. The semiconductor device according to claim 3, wherein:
   the interconnections interconnect the adjacent ones of the gate electrodes in end portions of the gate electrodes and in the bent portions; and
   the gate electrodes has a first finger portion between two of the be portions and a second finger portion between one of the end portions and one of the bent portion, the first and second portions having an identical width.

6. The semiconductor device according to claim 3, wherein:
   adjacent ones of the gate electrodes are not interconnected in the end portions;
   the interconnections interconnect the adjacent ones of the gate electrodes in the bent portions; and
   the gate electrodes has a first finger portion between two of the bent portions and a second finger portion between one of the end portions and one of the bent portion, the first portion being wider than the second portion.

7. The semiconductor device according to claim 3, wherein:
   the source pads are provided in longest finger portions of the source fingers;
   the drain pads are provided in longest finger portions of the drain fingers;
   at least the source pads or the drain pads are formed between adjacent ones of the gate electrodes; and
   at least the source pads or the drain pads pass through the semiconductor substrate.

8. The semiconductor device according to claim 4, wherein:
   the nitride semiconductor layer having a channel layer and an electron supply layer.

9. A semiconductor device comprising:
   source fingers having a stepwise side portions;
   drain fingers having a stepwise side portions of point symmetry to the stepwise side portions of the source fingers; and
   a gate electrodes located between the stepwise side portions of the source and the drain finger, the gate electrodes having straight portions and bent portions,
   wherein the source fingers, the drain fingers and the gate electrodes are formed on a semiconductor layer, and the semiconductor layer is a nitride semiconductor layer.

10. The semiconductor device according to claim 9, wherein the bent portions of the gate electrodes are located on inactive portions in the semiconductor layer.

11. The semiconductor device, according to claim 9, further having an interconnection formed above the source or drain finger, the bent portions of the gate electrodes adjacent to the source or drain finger are connected by the interconnection.

12. The semiconductor device according to claim 9, wherein:
   the nitride semiconductor layer having a channel layer and an electron supply layer.

* * * * *